United States Patent
Lim

(10) Patent No.: US 9,070,480 B2
(45) Date of Patent: Jun. 30, 2015

(54) SEMICONDUCTOR MEMORY DEVICE AND MEMORY SYSTEM INCLUDING THE SAME

(71) Applicant: SK hynix Inc., Gyeonggi-do (KR)

(72) Inventor: Sang Oh Lim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 2 days.

(21) Appl. No.: 14/083,006

(22) Filed: Nov. 18, 2013

(65) Prior Publication Data

US 2015/0016194 A1 Jan. 15, 2015

(30) Foreign Application Priority Data

Jul. 12, 2013 (KR) .......................... 10-2013-0081952

(51) Int. Cl.
*G11C 7/10* (2006.01)
*G11C 29/04* (2006.01)

(52) U.S. Cl.
CPC ...................................... *G11C 29/04* (2013.01)

(58) Field of Classification Search
CPC ....................................................... G11C 29/04
USPC ................... 365/189.05, 200, 230.06, 230.08
See application file for complete search history.

(56) References Cited

U.S. PATENT DOCUMENTS

| | | | | |
|---|---|---|---|---|
| 7,027,330 B2* | 4/2006 | Park | .......................... | 365/185.09 |
| 8,031,544 B2* | 10/2011 | Kim et al. | ..................... | 365/200 |
| 8,328,178 B2* | 12/2012 | Miyake et al. | ............... | 271/3.18 |
| 8,427,872 B2* | 4/2013 | Kim | ......................... | 365/185.09 |
| 8,477,547 B2* | 7/2013 | Park | ............................. | 365/200 |
| 8,634,261 B2* | 1/2014 | Kim | ............................. | 365/200 |
| 8,854,906 B2* | 10/2014 | Cho | ............................. | 365/200 |
| 2013/0201767 A1* | 8/2013 | Kim | ......................... | 365/189.05 |
| 2013/0315013 A1* | 11/2013 | Kim | ......................... | 365/189.16 |
| 2014/0108725 A1* | 4/2014 | Lee et al. | ..................... | 711/114 |

FOREIGN PATENT DOCUMENTS

KR 100327137 3/2002

* cited by examiner

*Primary Examiner* — Viet Q Nguyen
(74) *Attorney, Agent, or Firm* — IP & T Group LLP

(57) ABSTRACT

A semiconductor memory device and a memory system including the same are provided. The semiconductor memory device includes a first memory unit and a plurality of second memory unit, each including a plurality of memory cells and page buffers corresponding to the memory cells, and a redundancy memory unit including a plurality of redundancy memory cells and a plurality of redundancy page buffers corresponding to the redundancy memory cells. First input/output (I/O) data lines coupled to the first memory unit and second I/O data lines coupled to the second memory unit are coupled to the redundancy memory unit.

19 Claims, 6 Drawing Sheets

SEMICONDUCTOR MEMORY DEVICE AND MEMORY SYSTEM INCLUDING THE SAME

CROSS-REFERENCE TO RELATED APPLICATION

The present application claims priority to Korean patent application number 10-2013-0081952 filed on Jul. 12, 2013, in the Korean Intellectual Property Office, the entire disclosure of which is incorporated by reference herein.

BACKGROUND

1. Technical Field

Various exemplary embodiments relate to a semiconductor memory device and a memory system including the same.

2. Related Art

Semiconductor memory devices are classified into volatile semiconductor memory devices and nonvolatile semiconductor memory devices. The volatile semiconductor memory devices may be divided into dynamic random access memory (DRAM) devices and static RAM (SRAM) devices. Although the volatile semiconductor memory device reads and writes data at a high speed, the volatile semiconductor memory device loses stored data when external power supply is interrupted. The nonvolatile semiconductor memory devices may be divided into mask read-only memory (MROM) devices, programmable ROM (PROM) devices, erasable programmable ROM (EPROM) devices, and electrically erasable programmable ROM (EEPROM) devices. A nonvolatile semiconductor memory device retains stored data even if the external power supply is interrupted. Therefore, the nonvolatile semiconductor memory device is used to store data that should be retained irrespective of whether or not power is supplied.

A typical semiconductor memory device has a redundancy structure in which, when some of memory cells in the semiconductor memory device are defective, the defective cells are replaced by redundant cells to improve the performance of the entire chip. With increases in the integration density and capacity of semiconductor memory devices, the above-described redundancy structure has been necessitated. The redundancy structure of the semiconductor memory devices may be divided into a row redundancy structure and a column redundancy structure. In the row redundancy structure, when an element of a defective cell has a row directional defect, a row address is decoded using fuse cutting or a content addressable memory (CAM) cell to disable a word line of the defective cell and enable a word line of a redundant cell, so that the redundant cell may be used instead of the defective cell. When an element of a defective cell has a column directional defect, a column address is decoded using fuse cutting or a CAM cell to disable a column selection line of the defective cell and enable a column selection line of a redundant cell, so that the column directional defect may be repaired.

FIG. 1 is a block diagram illustrating a typical semiconductor memory device.

Referring to FIG. 1, the semiconductor memory device 10 may include a plurality of memory banks, i.e., first and second memory banks BANK0 and BANK1. Each of the first and second memory banks BANK0 and BANK1 may include a low-byte main memory unit 11, a high-byte main memory unit 12, a low redundancy memory unit 13, and a high redundancy memory unit 14 corresponding respectively to the low-byte main memory unit 11 and the high-byte main memory unit 12.

Since the semiconductor memory device 10 includes 32 global data lines and data are communicated through 8 I/O data lines IO during I/O operations, each of the first and second memory banks BANK0 and BANK1 includes the low-byte main memory unit 11 and the high-byte main memory unit 12 to be divided into four units. When defective columns occur, the low redundancy memory unit 13 and the high redundancy memory unit 14 may be required to repair the defective columns in the low-byte main memory unit 11 and the high-byte main memory unit 12. Since the low-byte main memory unit 11 and the high-byte main memory unit 12 use different I/O data lines IO/IOb<7:0> and IO/IOb<15:8>, many defective cells may occur in any one of the low-byte main memory unit 11 and the high-byte main memory unit 12. Thus, one of the low redundancy memory unit 13 and the high redundancy memory unit 14 is used excessively and may not program data any longer. Even if the other of the low redundancy memory unit 13 and the high redundancy memory unit 14 may additionally program data, the redundancy memory unit is not connected to the respective data lines, and may degrade redundancy efficiency.

BRIEF SUMMARY

Various exemplary embodiments are directed to a semiconductor memory device and a memory system including the same, which may improve redundancy efficiency of the semiconductor memory device.

An exemplary embodiment of the present invention provides a semiconductor memory device including a first memory unit and a second memory unit, each including a plurality of memory cells and a plurality of page buffers corresponding to the memory cells, and a redundancy memory unit including a plurality of redundancy memory cells and a plurality of redundancy page buffers corresponding to the redundancy memory cells. First input/output (I/O) data lines coupled to the first memory unit and second I/O data lines coupled to the second memory unit are coupled to the redundancy memory unit.

An exemplary embodiment of the present invention provides a semiconductor memory device including a low-byte main memory unit and a high-byte main memory unit, each including a plurality of memory cells and a plurality of page buffers corresponding to the memory cells, and a redundancy memory unit including a plurality of redundancy memory cells and a plurality of redundancy page buffers corresponding to the redundancy memory cells. The low-byte main memory unit and the high-byte main memory unit share the redundancy memory unit with each other during a redundancy operation.

An exemplary embodiment of the present invention provides a memory system including a semiconductor memory device including a first memory unit, a second memory unit, and a redundancy memory unit suitable for performing a redundancy operation on the first and second memory units, and a controller suitable for controlling the semiconductor memory device. The first memory unit and the second memory unit share the redundancy memory unit with each other during the redundancy operation.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION

Figure 1:
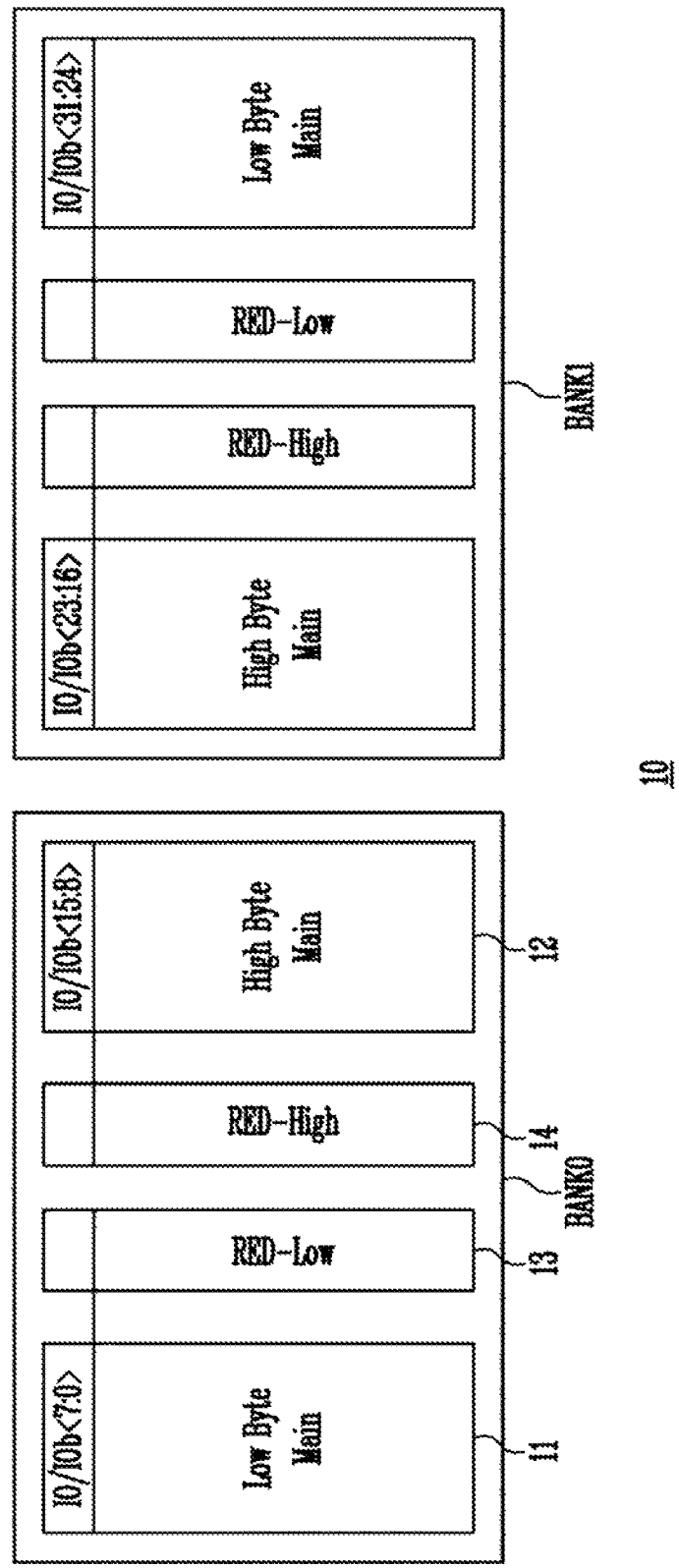
FIG. 1 is a block diagram illustrating a typical semiconductor memory device.

Embodiments of the present invention will now be described more fully hereinafter with reference to the accompanying drawings, in which exemplary embodiments of the present invention are shown. This invention may, however, be embodied in different forms and should not be construed as limited to the embodiments set forth herein. Rather, these embodiments are provided so that this disclosure is thorough and complete and fully conveys the scope of the present invention to one skilled in the art. Throughout the disclosure, reference numerals correspond directly to the like parts in the various figures and embodiments of the present invention.

Herein, it will be understood that when an element is referred to as being "connected" or "coupled" to another element, it can be directly connected or coupled to the other element or indirectly connected or coupled to the other element by intervening another element therebetween. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Figure 2:
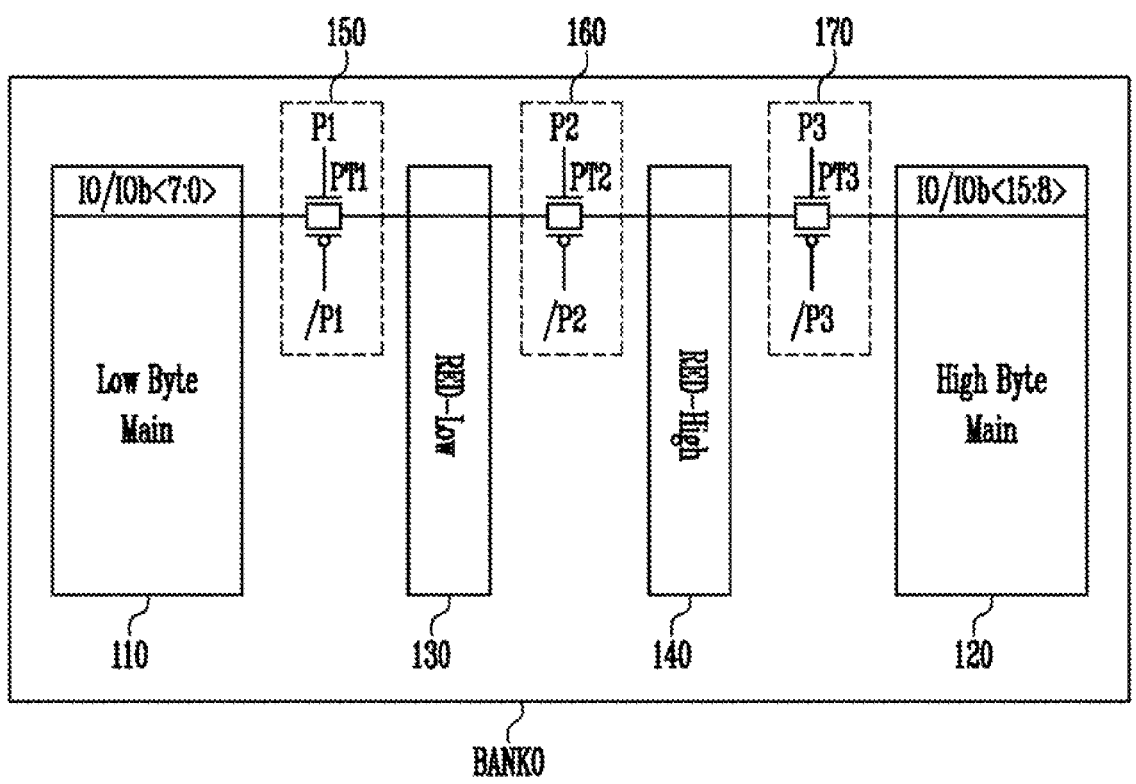
FIG. 2 is a block diagram illustrating a semiconductor memory device according to an exemplary embodiment of the present invention.

FIG. 2 is a block diagram illustrating a semiconductor memory device according to an exemplary embodiment of the present invention.

Referring to FIG. 2, the semiconductor memory device 100 may include a memory bank BANK0. The memory bank BANK0 may include a low-byte main memory unit 110, a high-byte main memory unit 120, a low-byte redundancy memory unit 130 corresponding to the low-byte main memory unit 110, a high-byte main memory unit 120 corresponding to the high-byte main memory unit 120, and a plurality of data transmitters, i.e., first to third data transmitters 150, 160, and 170.

Although the exemplary embodiment of the present invention illustrates only one memory bank BANK0, the semiconductor memory device may include a plurality of memory banks, each of which may have the same structure as the memory bank BANK0 shown in FIG. 2.

The first data transmitter 150 may be coupled between the low-byte main memory unit 110 and the low-byte redundancy memory unit 130, and control a connection of I/O data lines IO/IOb<7:0> between the low-byte main memory unit 110 and the low-byte redundancy memory unit 130 in response to first pass signals P1 and /P1. The second data transmitter 160 may be coupled between the low-byte redundancy memory unit 130 and the high-byte redundancy memory unit 140, and control a connection of data lines of the low-byte redundancy memory unit 130 and the high-byte redundancy memory unit 140 in response to second pass signals P2 and /P2. The third data transmitter 170 may be coupled between the high-byte main memory unit 120 and the high-byte redundancy memory unit 140, and control a connection of I/O data lines IO/IOb<15:8> between the high-byte redundancy memory unit 140 and the high-byte main memory unit 120 in response to third pass signals P3 and /P3.

The first to third data transmitters 150 to 170 may include pass transistors PT1, PT2, and PT3, respectively.

In the above-described configuration, when many defective cells occur in the low-byte main memory unit 110, it is difficult to repair the defective cells using only the low-byte redundancy memory unit 130. At this time, the first and second data transmitters 150 and 160 may be enabled so that the I/O data lines IO/IOb<7:0> of the low-byte main memory unit 110 may be coupled to the data lines of the high-byte redundancy memory unit 140 through the data lines of the low-byte redundancy memory unit 130. Thus, the low-byte redundancy memory unit 130 and the high-byte redundancy memory unit 140 may be used in a redundancy operation for the low-byte main memory unit 110.

In addition, when many defective cells occur in the high-byte main memory unit 120, it is difficult to repair the defective cells using only the high-byte redundancy memory unit 140. At this time, the second and third data transmitters 160 and 170 may be enabled so that the I/O data lines IO/IOb<15:8> of the high-byte main memory unit 120 may be coupled to the data lines of the low-byte redundancy memory unit 130 through the data lines of the high-byte redundancy memory unit 140. Thus, the low-byte redundancy memory unit 130 and the high-byte redundancy memory unit 140 may be used in a redundancy operation for the high-byte main memory unit 120.

However, in the above-described structure, since turn-on resistances of the pass transistors PT1, PT2, and PT3 may act as resistance elements of the data lines, high-speed sensing operations may be degraded.

In addition, when the defective cells of the low-byte main memory unit 110 and the high-byte main memory unit 120 have the same address, it is difficult to alternately use the redundancy memory units 130 and 140 due to address redundancy.

Figure 3:
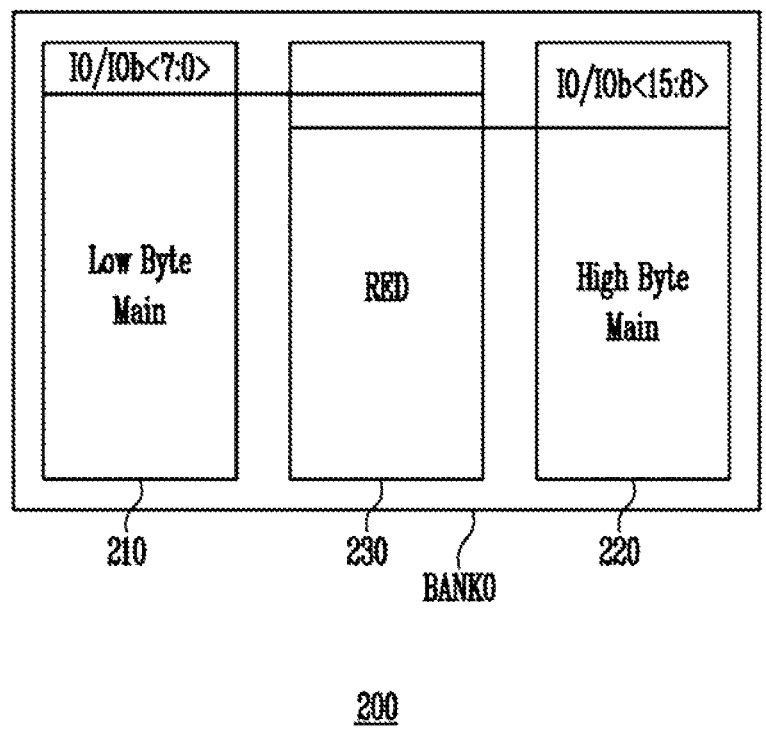
FIG. 3 is a block diagram illustrating a semiconductor memory device according to an exemplary embodiment of the present invention.

FIG. 3 is a block diagram illustrating a semiconductor memory device according to an exemplary embodiment of the present invention.

Referring to FIG. 3, the semiconductor memory device 200 may include a memory bank BANK0. The memory bank BANK0 may include a low-byte main memory unit 210, a high-byte main memory unit 220, and a redundancy memory unit 230. Each of the low-byte main memory unit 210 and the high-byte main memory unit 220 may include a plurality of memory cells and a plurality of page buffers corresponding to the plurality of memory cells.

The redundancy memory unit 230 may include a plurality of redundancy memory cells and a plurality of redundancy page buffers corresponding to the plurality of redundancy memory cells.

The redundancy memory unit 230 may be coupled to I/O data lines IO/IOb<7:0> of the low-byte main memory unit 210 and I/O data lines IO/IOb<15:8> of the high-byte main memory unit 220.

In the above-described configuration, the redundancy memory unit 230 may perform a redundancy operation for both the low-byte main memory unit 210 and the high-byte main memory unit 220. When defective cells to be repaired occur in the low-byte main memory unit 210 or the high-byte main memory unit 220, the redundancy memory unit 230 may perform the redundancy operation through the I/O data lines IO/IOb<7:0> and the I/O data lines IO/IOb<15:8>.

Although the exemplary embodiment of the present invention illustrates only one memory bank BANK0, the semiconductor memory device may include a plurality of memory banks, each of which may have the same structure as the memory bank BANK0 shown in FIG. 3.

Figure 4:
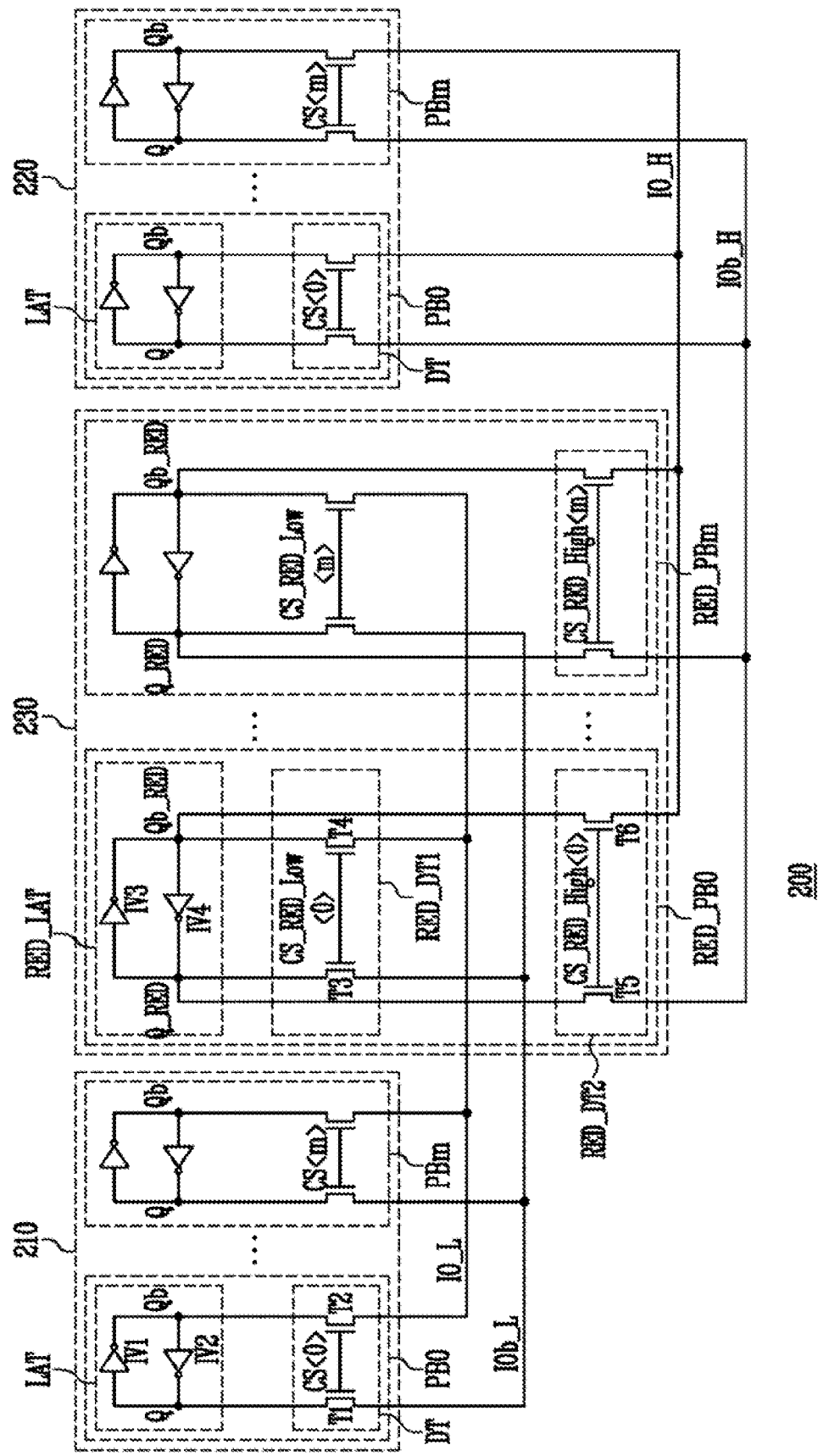
FIG. 4 is a detailed circuit diagram explaining a connection relationship among a low-byte main memory unit, a high-byte main memory unit, and a redundancy memory unit shown in FIG. 3.

FIG. 4 is a detailed circuit diagram explaining a connection relationship among the low-byte main memory unit 210, the high-byte main memory unit 220, and the redundancy memory unit 230 shown in FIG. 3.

Referring to FIG. 4, the low-byte main memory unit 210 may include a plurality of page buffers PB0 to PBm coupled to lower memory cells (not shown). Each of the page buffers PB0 to PBm may include a latch LAT configured to latch data stored in the corresponding lower memory cell, and a data transmitter DT configured to output data stored in the latch LAT to a pair of I/O data lines IO_L and IOb_L of the I/O data lines IO/IOb<7:0> shown in FIG. 3, or output data input through the I/O data lines IO_L and IOb_L to the latch LAT.

The latch LAT may be implemented with an inverter latch, which includes inverters IV1 and IV2 coupled in parallel between a first node Q and a second node Qb in an inverse direction.

The data transmitter DT may include a transistor T1 coupled between the first node Q of the latch LAT and the I/O data line IOb_L, and a transistor T2 coupled between the second node Qb and the I/O data line IO_L. The transistors T1 and T2 may have gates coupled to each other, and connect the first node Q and the second node Qb of the latch LAT with the I/O data lines IOb_L and IO_L in response to a corresponding one of column selection signals CS<0:m>, respectively.

The high-byte main memory unit 220 may include a plurality of page buffers PB0 to PBm coupled to upper memory cells (not shown). Each of the page buffers PB0 to PBm may include a latch LAT configured to latch data stored in the corresponding upper memory cell, and a data transmitter DT configured to output data stored in the latch LAT to a pair of I/O data lines IO_H and IOb_H of the I/O data lines IO/IOb<15:8> shown in FIG. 3, or output data input through the I/O data lines IO_H and IOb_H to the latch LAT.

The latch LAT and the data transmitter DT included in each of the page buffers PB0 to PBm of the high-byte main memory unit 220 may have substantially the same structures as the latch LAT and the data transmitter DT included in each of the page buffers PB0 to PBm of the low-byte main memory unit 210.

The redundancy memory unit 230 may include a plurality of redundancy page buffers RED_PB0 to RED_PBm coupled to redundancy memory cells (not shown). Each of the redundancy page buffers RED_PB0 to RED_PBm may include a latch RED_LAT configured to latch data stored in the corresponding redundancy memory cell, a first redundancy data transmitter RED_DT1 configured to output data stored in the latch RED_LAT to the I/O data lines IO_L and IOb_L of the I/O data lines IO/IOb<7:0> shown in FIG. 3, or output data input through the I/O data lines IO_L and IOb_L to the latch RED_LAT, and a second redundancy data transmitter RED_DT2 configured to output data stored in the latch RED_LAT to the I/O data lines IO_H and IOb_H of the I/O data lines IO/IOb<15:8> shown in FIG. 3, or output data input through the I/O data lines IO_H and IOb_H to the latch RED_LAT.

The latch RED_LAT may be implemented with an inverter latch, which includes inverters IV3 and IV4 coupled in parallel between a third node Q_RED and a fourth node Qb_RED in a reverse direction.

The first redundancy data transmitter RED_DT1 may include a transistor T3 coupled between the third node Q_RED of the latch RED_LAT and the I/O data line IOb_L, and a transistor T4 coupled between the fourth node Qb_RED and the I/O data line IO_L. The transistors T3 and T4 may have gates coupled to each other, and connect the third node Q_RED and the fourth node Qb_RED of the latch RED_LAT with the I/O data line IOb_L and IO_L in response to a corresponding one of low-byte redundancy column selection signals CS_RED_Low<0:m>, respectively.

The second redundancy data transmitter RED_DT2 may include a transistor T5 coupled between the third node Q_RED of the latch RED_LAT and the I/O data line IOb_H, and a transistor T6 coupled between the fourth node Qb_RED of the latch RED_LAT and the I/O data line IO_H. The transistors T5 and T6 may have gates coupled to each other, and connect the third node Q_RED and the fourth node Qb_RED of the latch RED_LAT with the I/O data lines IOb_H and IO_H in response to a corresponding one of high-byte redundancy column selection signals CS_RED_High<0:m>, respectively.

Hereinafter, a redundancy operation of the semiconductor memory device 200 will be described with reference to FIG. 4.

It is assumed that a memory cell coupled to some columns of the low-byte main memory unit 210 is determined as a defective cell, and a column corresponding to the defective cell is coupled to the page buffer PB0. When an address corresponding to the defective cell is input during a data program or read operation, the column selection signal CS<0> of the low-byte main memory unit 210 may be disabled, and the low-byte redundancy column selection signal CS_RED_Low<0> of the redundancy memory unit 230 may be enabled. Thus, the I/O data lines IO_L and IOb_L may be coupled to the redundancy page buffer RED_PB0 to perform the data program or read operation.

In addition, it is assumed that a memory cell coupled to some columns of the high-byte main memory unit 220 is determined as a defective cell, and a column corresponding to the defective cell is coupled the page buffer PBm. When an address corresponding to the defective cell is input during a data program or read operation, the column selection signal CS<m> of the high-byte main memory unit 220 may be disabled, and the high-byte redundancy column selection signal CS_RED_High<m> of the redundancy memory unit 230 may be enabled. Thus, the I/O data lines IO_H and IOb_H may be coupled to the redundancy page buffer RED_PBm to perform the data program or read operation.

Furthermore, it is assumed that memory cells having the same address in the low-byte main memory unit 210 and the high-byte main memory unit 220 are determined as defective cells, and thus the redundancy operation for the low-byte main memory unit 210 and the high-byte main memory unit 220 is required. At this time, the redundancy memory unit 230 may perform the redundancy operation for both of the low-byte main memory unit 210 and the high-byte main memory unit 220 by decoding respective addresses and allocating different redundancy column selection signals. For example, when memory cells having the same address in the low-byte main memory unit 210 and the high-byte main memory unit 220 are determined as defective cells, the low-byte redundancy column selection signal CS_RED_Low<0> may be enabled during a redundancy operation for the defective cell of the low-byte main memory unit 210, and the high-byte redundancy column selection signal CS_RED_High<1> may be enabled during a redundancy operation for the defective cell of the high-byte main memory unit 220. That is, the I/O data lines IO_L and IOb_L coupled to the defective cell in the low-byte main memory unit 210 is coupled to the latch RED_LAT of the redundancy page buffers RED_PB0 in response to the low-byte redundancy column selection signal CS_RED_Low<0>. Further, the I/O data lines IO_H and IOb_H coupled to the defective cell in the high-byte main memory unit 220 is coupled to the latch RED_LAT of the redundancy page buffers RED_PB1, different from the redundancy page buffers RED_PB0, in response to the high-byte redundancy column selection signal CS_RED_High<1>. As a result, address redundancy may be improved.

As described above, the low-byte main memory unit 210 and the high-byte main memory unit 220 may share one redundancy memory unit 230 with each other. Thus, the alternate use of a redundancy memory unit corresponding to another main memory unit due to lack of capacity of the redundancy memory unit may be prevented during a redundancy operation. Further, a reduction in speed due to a resistance of a pass transistor when two redundancy memory units are alternately used may be improved.

Figure 5:
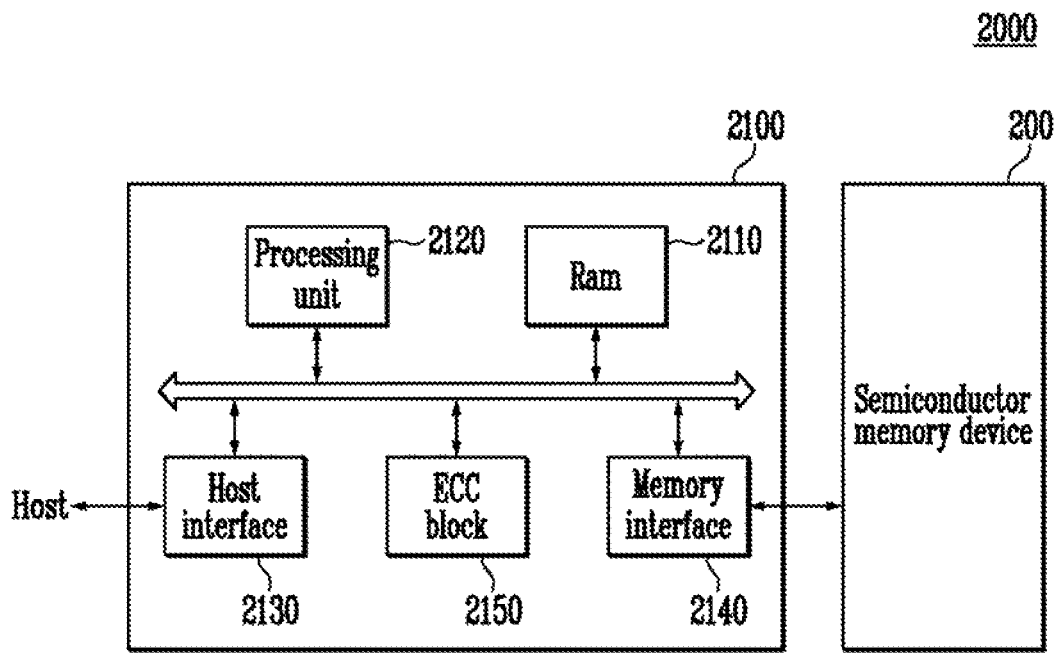
FIG. 5 is a block diagram illustrating a memory system including a semiconductor memory device according to an exemplary embodiment of the present invention.

FIG. 5 is a block diagram illustrating a memory system including a semiconductor memory device according to an exemplary embodiment of the present invention. In FIG. 5, the semiconductor memory device may include the semiconductor memory device 200 of FIG. 4.

Referring to FIG. 5, the memory system 2000 may include the semiconductor memory device 200 and a controller 2100.

Since configuration and operations of the semiconductor memory device 200 are the same as described with reference to FIG. 3, a repeated description thereof is omitted.

The controller 2100 may be coupled to a host and the semiconductor memory device 200. The controller 2100 may access the semiconductor memory device 200 upon a request from the host. For example, the controller 2100 may control read, write, erase, and background operations of the semiconductor memory device 200. The controller 2100 may provide an interface between the semiconductor memory device 200 and the host. The controller 2100 may execute firmware required to control the semiconductor memory device 200.

The controller 2100 may include a random access memory (RAM) 2110, a processing unit 2120, a host interface 2130, a memory interface 2140, and an error correcting code (ECC) block 2150. The RAM 2110 may be used as at least one of an operation memory of the processing unit 2120, a cache memory between the semiconductor memory device 200 and the host, and a buffer memory between the semiconductor memory device 200 and the host. The processing unit 2120 may control general operations of the controller 2100.

The host interface 2130 may include a protocol configured to exchange data between the host and the controller 2100. In an exemplary embodiment, the controller 2100 may communicate with the host through at least one of various interface protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA (SATA) protocol, a parallel-ATA (PATA) protocol, a small computer small interface (SCSI) protocol, an enhanced small disk interface (ESDI) protocol, an integrated drive electronics (IDE) protocol, and a private protocol.

The memory interface 2140 may interface with the semiconductor memory device 200. For instance, the memory interface 2140 may include a NAND interface or a NOR Interface.

The ECC block 2150 may detect errors in data received from the semiconductor memory device 200 using error correcting codes (ECC) and correct the errors. The processing unit 2120 may control a read voltage based on error detection results of the ECC block 2150, and control the semiconductor memory device 200 to perform a re-read operation. In an exemplary embodiment, the ECC block 2150 may be provided as a component of the controller 2100.

The controller 2100 and the semiconductor memory device 200 may be integrated in one semiconductor device. In an exemplary embodiment, the controller 2100 and the semiconductor memory device 200 may be integrated in a single semiconductor device and constitute a memory card. For example, the controller 2100 and the semiconductor memory device 200 may be integrated in one semiconductor device and constitute a memory card, such as a Personal Computer Memory Card International Association (PCMCIA) card, a compact flash (CF) card, a smart media card (SMC), a memory stick, a multimedia card (MMC, a reduced-size MMC (RS-MMC), or MMCmicro), a secure digital card (SD, miniSD, microSD, or secure digital high capacity (SDHC)), and a universal flash storage (UFS).

The controller 2100 and the semiconductor memory device 200 may be integrated in a single semiconductor device and constitute a solid-state drive (SSD). The SSD may include a storage device configured to store data in a semiconductor memory. When the memory system 2000 is used as the SSD, an operation speed of the host coupled to the memory system 2000 may be greatly improved.

In another example, the memory system 2000 may be provided as one of various components of an electronic apparatus such as a computer, ultra mobile PC (UMPC), workstation, net-book, personal digital assistant (PDA), portable computer, web tablet, wireless phone, mobile phone, smart phone, e-book, portable multimedia player (PMP), portable game console, navigation device, black box, digital camera, 3-dimensional television, digital audio recorder, digital audio player, digital picture recorder, digital picture player, digital video recorder, digital video player, apparatus capable of transmitting and receiving information in a wireless environment, one of various electronic apparatuses constituting a home network, one of various electronic apparatuses constituting a computer network, one of various electronic apparatuses constituting a telematics network, a radio-frequency identification (RFID) device, and one of various components forming a computing system.

In an exemplary embodiment, the semiconductor memory device 200 or the memory system 2000 may be mounted in a package having various shapes. For example, the semiconductor memory device 200 or the memory system 2000 may be mounted in a package using various techniques, such as package on package (PoP), ball grid arrays (BGAs), chip scale packages (CSPs), plastic leaded chip carrier (PLCC), plastic dual in line package (PDIP), die in waffle pack (DWP), die in wafer form (DWF), chip on board (COB), ceramic dual in-line package (CERDIP), plastic metric quad flat pack (MQFP), thin quad flatpack (TQFP), small outline integrated circuit (SOIC), shrink small outline package (SSOP), thin small outline package (TSOP), thin quad flatpack (TQFP), system in package (SIP), multi chip package (MCP), wafer-level fabricated package (WFP), and wafer-level processed stack package (WSP).

Figure 6:
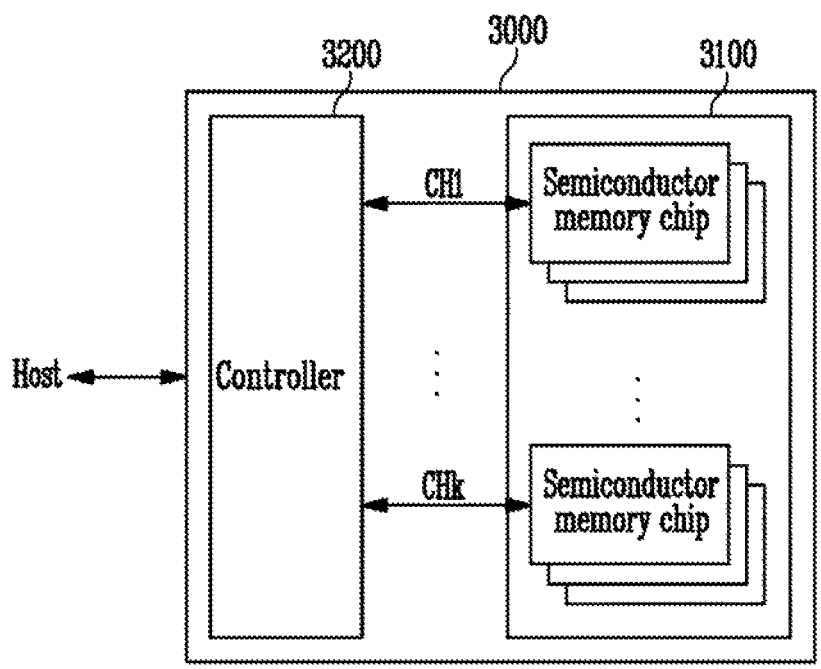
FIG. 6 is a block diagram illustrating a memory system including a semiconductor memory device according to an exemplary embodiment of the present invention.

FIG. 6 is a block diagram illustrating a memory system including a semiconductor memory device according to an exemplary embodiment of the present invention. In FIG. 6, the semiconductor memory device may include the semiconductor memory device 200 of FIG. 4.

Referring to FIG. 6, the memory system 3000 may include a semiconductor memory device 3100 and a controller 3200. The semiconductor memory device 3100 may include a plurality of semiconductor memory chips. The plurality of semiconductor memory chips may be divided into a plurality of groups.

FIG. 6 illustrates an example in which the plurality of groups communicate with the controller 3200 through first through k-th channels CH1 to CHk, respectively. Configuration and operations of each of the semiconductor memory chips may be the same as that of the semiconductor memory device 200 described with reference to FIG. 3.

Each of the groups may communicate with the controller 3200 through one common channel. The controller 3200 may have the same configuration as the controller 2100 described with reference to FIG. 5 and may control the plurality of memory chips of the semiconductor memory device 3100 through the plurality of channels CH1 to CHk.

FIG. 6 illustrates an example in which a plurality of semiconductor memory chips are coupled to one channel. However, it will be understood that the memory system 3000 may be modified so that one semiconductor memory chip is coupled to one channel.

Figure 7:
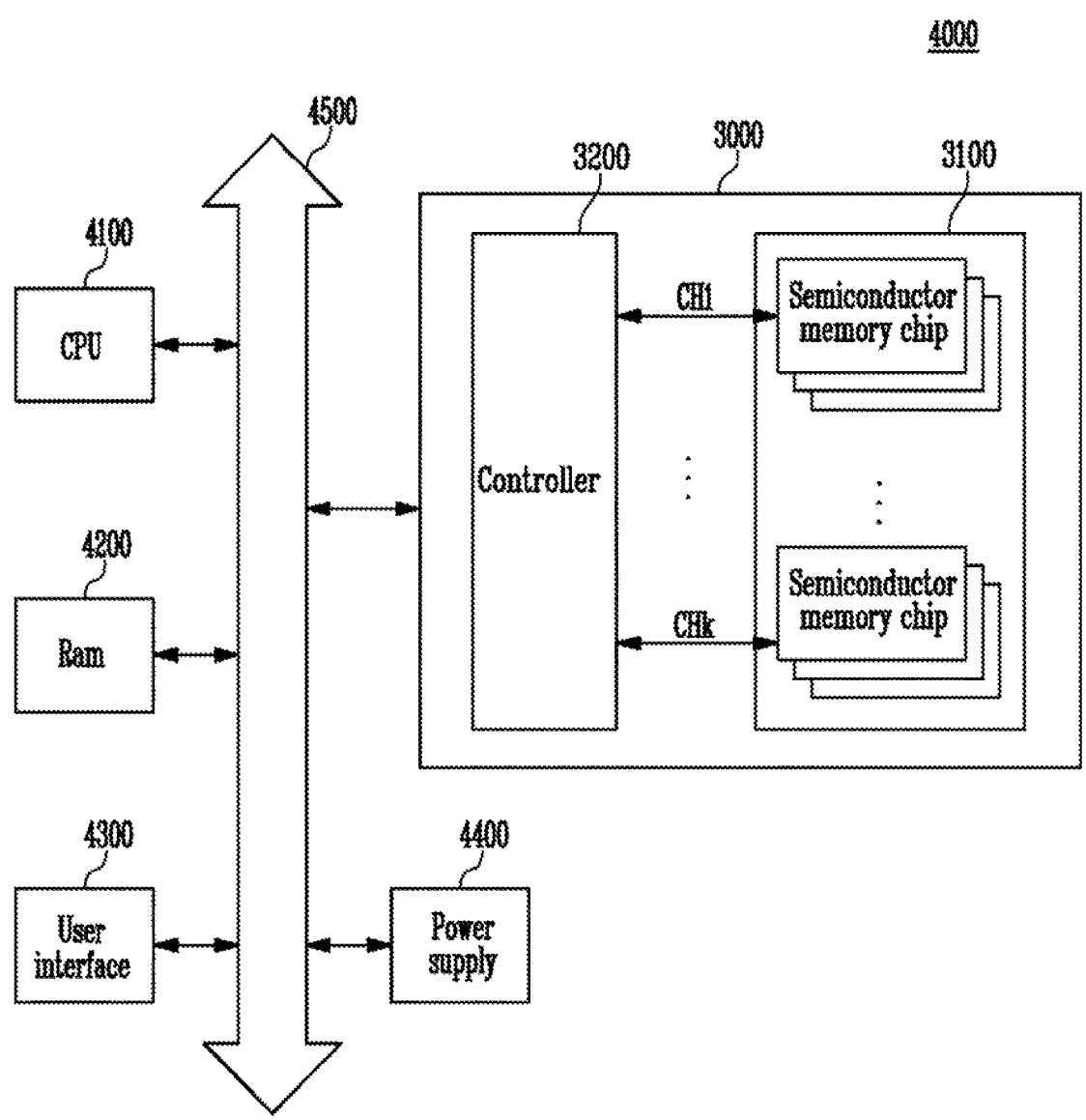
FIG. 7 is a block diagram illustrating a computing system including a memory system according to an exemplary embodiment of the present invention.

FIG. 7 is a block diagram illustrating a computing system including a memory system according to an exemplary embodiment of the present invention. In FIG. 7, the memory system may include the memory system 3000 of FIG. 6.

Referring to FIG. 7, the computing system 4000 may include a central processing unit (CPU) 4100, a RAM 4200, a user interface 4300, a power supply 4400, a system bus 4500, and the memory system 3000.

The memory system 3000 may be electrically coupled to the CPU 4100, the RAM 4200, the user interface 4300, and the power supply 4400 through the system bus 4500. Data provided through the user interface 4300 or data processed by the CPU 4100 may be stored in the memory system 3000.

FIG. 7 illustrates an example in which the semiconductor memory device 3100 is coupled to the system bus 4500 through the controller 3200. However, the semiconductor memory device 3100 may be directly connected to the system bus 4500. In this case, functions of the controller 3200 may be performed by the CPU 4100 and the RAM 4200.

FIG. 7 illustrates an example in which the memory system 3000 described with reference to FIG. 6 is provided. However, the memory system 3000 may be replaced by the memory system 2000 described with reference to FIG. 5. In an exemplary embodiment, the computing system 4000 may include both of the memory systems 2000 and 3000 described with reference to FIGS. 5 and 6.

According to the present invention, a low-byte main memory unit and a high-byte main memory unit included in one memory bank may share one redundancy memory unit with each other to improve redundancy efficiency.

Typical exemplary embodiments of the invention are disclosed in the above description and the drawings. Although specific terms are employed, they are used in a generic and descriptive sense only and not for purposes of limitation. It will be understood by those of ordinary skill in the art that various changes in form and details may be made to the disclosed embodiments without departing from the spirit and scope of the present invention as defined by the following claims.

What is claimed is:

1. A semiconductor memory device comprising:
   a first memory unit and a second memory unit, each including a plurality of memory cells and a plurality of page buffers corresponding to the memory cells; and
   a redundancy memory unit including a plurality of redundancy memory cells and a plurality of redundancy page buffers corresponding to the redundancy memory cells,
   wherein first input/output (I/O) data lines coupled to the first memory unit and second I/O data lines coupled to the second memory unit are coupled to the redundancy memory unit,
   wherein, when memory cells having the same address in the first and second memory units are determined as defective cells, different redundancy column selection signals are assigned by coding addresses corresponding to the first memory unit and the second memory unit, respectively.

2. The semiconductor memory device of claim 1, wherein each of the redundancy page buffers comprises:
   a redundancy latch suitable for latching data;
   a first redundancy data transmitter suitable for connecting the redundancy latch with a pair of I/O data lines of the first I/O data lines; and
   a second redundancy data transmitter suitable for connecting the redundancy latch with a pair of I/O data lines of the second I/O data lines.

3. The semiconductor memory device of claim 1, wherein each of the page buffers of the first memory unit comprises:
   a latch suitable for latching data; and
   a data transmitter suitable for connecting the latch with a pair of I/O data lines of the first I/O data lines.

4. The semiconductor memory device of claim 1, wherein each of the page buffers of the second memory unit comprises:
   a latch suitable for latching data; and
   a data transmitter suitable for connecting the latch with a pair of I/O data lines of the second I/O data lines.

5. The semiconductor memory device of claim 1, wherein, during a redundancy operation, the first memory unit and the second memory unit share the redundancy memory unit with each other.

6. The semiconductor memory device of claim 2, wherein the first redundancy data transmitter connects the redundancy latch with the pair of I/O data lines of the first I/O data lines in response to a corresponding one of first redundancy column selection signals, and
   the second redundancy data transmitter connects the redundancy latch with the pair of I/O data lines of the second I/O data lines in response to a corresponding one of second redundancy column selection signals.

7. The semiconductor memory device of claim 6, wherein, when memory cells having the same address in the first and second memory units are determined as defective cells, different addresses are allocated to the corresponding one of the first redundancy column selection signals and the corresponding one of the second redundancy column selection signals during a redundancy operation.

8. A semiconductor memory device comprising:
   a low-byte main memory unit and a high-byte main memory unit, each including a plurality of memory cells and a plurality of page buffers corresponding to the memory cells; and a redundancy memory unit including a plurality of redundancy memory cells and a plurality of redundancy page buffers corresponding to redundancy memory cells, wherein the low-byte main memory unit and the high-byte main memory unit share the redundancy memory unit with each other during a redundancy operation, wherein, when memory cells having the same address in the low-byte main memory unit and the high-byte main memory unit are determined as defective cells, different redundancy column selection signals are assigned by coding addresses corresponding to the high-byte main memory unit and the low-byte main memory unit, respectively.

9. The semiconductor memory device of claim 8, wherein first I/O data lines coupled to the low-byte main memory unit and second I/O data lines coupled to the high-byte main memory unit are coupled to the redundancy memory unit, wherein the first I/O data lines and the second I/O data lines are coupled to the redundancy page buffers of the redundancy memory unit during the redundancy operation.

10. The semiconductor memory device of claim 9, wherein each of the redundancy page buffers comprises:

a redundancy latch suitable for latching data;

a first redundancy data transmitter suitable for connecting the redundancy latch with a pair of I/O data lines of the first I/O data lines; and a second redundancy data transmitter suitable for connecting the redundancy latch with a pair of I/O data lines of the second I/O data lines.

11. The semiconductor memory device of claim 9, wherein each of the page buffers of the low-byte main memory unit comprises:

a latch suitable for latching data; and a data transmitter suitable for connecting the latch with a pair of I/O data lines of the first I/O data lines.

12. The semiconductor memory device of claim 9, wherein each of the page buffers of the high-byte main memory unit comprises:

a latch suitable for latching data; and a data transmitter suitable for connecting the latch with a pair of I/O data lines of the second I/O data lines.

13. The semiconductor memory device of claim 10, wherein the first redundancy data transmitter connects the redundancy latch with the pair of I/O data lines of the first I/O data lines in response to a corresponding one of first redundancy column selection signals, and the second redundancy data transmitter connects the redundancy latch with the pair of I/O data lines of the second I/O data lines in response to a corresponding one of second redundancy column selection signals.

14. The semiconductor memory device of claim 13, wherein, when memory cells having the same address in the low-byte main memory unit and the high-byte main memory unit are determined as defective cells, different addresses are allocated to the corresponding one of the first redundancy column selection signals and the corresponding one of the second redundancy column selection signals during the redundancy operation.

15. A memory system comprising:

a semiconductor memory device including a first memory unit, a second memory unit, and a redundancy memory unit suitable for performing a redundancy operation on the first and second memory units; and a controller suitable for controlling the semiconductor memory device, wherein the first memory unit and the second memory unit share the redundancy memory unit with each other during the redundancy operation, wherein, when memory cells having the same address in the first memory unit and the second memory unit are determined as defective cells, different redundancy column selection signals are assigned by coding addresses corresponding to the first memory unit and the second memory unit, respectively.

16. The memory system of claim 15, wherein first I/O data lines coupled to the first memory unit and second I/O data lines coupled to the second memory unit are coupled to the redundancy memory unit, wherein the first I/O data lines and the second I/O data lines are coupled to redundancy page buffers of the redundancy memory unit during the redundancy operation.

17. The memory system of claim 16, wherein each of the redundancy page buffers comprises:

a redundancy latch suitable for latching data stored in redundancy memory cells of the redundancy memory unit;

a first redundancy data transmitter suitable for connecting the redundancy latch with a pair of I/O data lines of the first I/O data lines; and a second redundancy data transmitter suitable for connecting the redundancy latch with a pair of I/O data lines of the second I/O data lines.

18. The memory system of claim 17, wherein the first redundancy data transmitter connects the redundancy latch with the pair of I/O data lines of the first I/O data lines in response to a corresponding one of first redundancy column selection signals, and the second redundancy data transmitter connects the redundancy latch with the pair of I/O data lines of the second I/O data lines in response to a corresponding one of second redundancy column selection signals.

19. The memory system of claim 18, wherein, when memory cells having the same address in the first memory unit and the second memory unit are determined as defective cells, different addresses are allocated to the corresponding one of the first redundancy column selection signals and the corresponding one of the second redundancy column selection signals during the redundancy operation.

* * * * *